(12) United States Patent
He et al.

(10) Patent No.: US 10,673,448 B2
(45) Date of Patent: Jun. 2, 2020

(54) SYSTEM AND METHOD FOR REGULATING TRANSFER CHARACTERISTICS OF INTEGRAL ANALOG-TO-DIGITAL CONVERTER

(71) Applicants: SHANGHAI IC R&D CENTER CO., LTD., Shanghai (CN); CHENGDU IMAGE DESIGN TECHNOLOGY CO. LTD., Chengdu (CN)

(72) Inventors: Xuehong He, Shanghai (CN); Changming Pi, Shanghai (CN); Hailing Yang, Shanghai (CN)

(73) Assignees: SHANGHAI IC R&D CENTER CO., LTD, Shanghai (CN); CHENGDU IMAGE DESIGN TECHNOLOGY CO., LTD., Chengdu (CN)

(*) Notice: Subject to any disclaimer, the term of this patent is extended or adjusted under 35 U.S.C. 154(b) by 0 days.

(21) Appl. No.: 16/343,785

(22) PCT Filed: Nov. 22, 2017

(86) PCT No.: PCT/CN2017/112352
§ 371 (c)(1),
(2) Date: Apr. 22, 2019

(87) PCT Pub. No.: WO2018/099304
PCT Pub. Date: Jun. 7, 2018

(65) Prior Publication Data
US 2019/0268012 A1    Aug. 29, 2019

(30) Foreign Application Priority Data
Nov. 30, 2016    (CN) .......................... 2016 1 1077205

(51) Int. Cl.
*H03M 1/06*    (2006.01)
*H03M 1/52*    (2006.01)
(Continued)

(52) U.S. Cl.
CPC .......... *H03M 1/0612* (2013.01); *H03M 1/52* (2013.01); *H03M 1/10* (2013.01); *H03M 1/12* (2013.01); *H03M 3/30* (2013.01)

(58) Field of Classification Search
CPC ............ H03M 1/06; H03M 1/12; H03M 1/10; H03M 3/30
(Continued)

(56) References Cited

U.S. PATENT DOCUMENTS 9,401,728 B2 *    7/2016    Doare .................... H03M 3/378

FOREIGN PATENT DOCUMENTS

CN    101764616 A1    6/2010

* cited by examiner

*Primary Examiner* — Joseph J Lauture
(74) *Attorney, Agent, or Firm* — Tianchen LLC.; Yuan R. Li; Yi Fan Yin

(57) ABSTRACT

A system and method for regulating transfer characteristics of an integral analog-to-digital converter are provided. The system comprises a cascade N-stage integrator structure having N integrators, the input end of the first integrator is connected to a voltage, the output end of each integrator is connected to the input end of the adjacent integrator, and the output end of the Nth integrator is connected to an output node (VRAMP). Wherein, the N is positive integer greater than or equal to 2. In the cascade multistage integrator structure, the voltage of the output node (VRAMP) is in direct proportion relation with the time to the power of N. By adopting a cascade multistage integrator according to the present disclosure, it is simple to regulate transfer characteristics of the ADC, and the cascade digital signal processing is convenient, which can reduce the ADC conversion time and improve the ADC conversion rate. Compared with
(Continued)

the existing polyline mode, the present disclosure has better linearity; and it can be easily extended to cascade multistage integrators.

6 Claims, 3 Drawing Sheets

(51) Int. Cl.
*H03M 3/00* (2006.01)
*H03M 1/12* (2006.01)
*H03M 1/10* (2006.01)

(58) Field of Classification Search
USPC .............................. 341/118, 120, 155, 143
See application file for complete search history.

--Prior Art--

--Prior Art--

--Prior Art--

--Prior Art--

SYSTEM AND METHOD FOR REGULATING TRANSFER CHARACTERISTICS OF INTEGRAL ANALOG-TO-DIGITAL CONVERTER

CROSS-REFERENCE TO RELATED APPLICATION

This application claims the priority of International Patent Application Serial No. PCT/CN2017/112352, filed Nov. 22, 2017, which is related to and claims the priority of Chinese patent application Serial No. 201611077205.5 filed Nov. 30, 2016. The entirety of each of the above-mentioned patent applications is hereby incorporated herein by reference and made a part of the specification.

TECHNICAL FIELD

The present disclosure relates to the technical field of integrated circuits, and more specifically, to a system and method for regulating transfer characteristics of an integral analog-to-digital converter.

BACKGROUND

The integral analog-to-digital converter (ADC) is widely used in chips, especially in sensor chips, because of its simple structure and high accuracy. However, due to the disadvantage of slow conversion rate, it is often necessary to make some improvements to the traditional integrated ADC to meet the needs of the system. Such improvements usually sacrifice the performance of one aspect of the ADC in exchange for the improvement of the performance of the other aspect, in the hope that the whole system can show better performance.

FIG. 1 is a schematic structural diagram of a conventional integral ADC, which is mainly composed of a comparator (COMP), a counter (COUNTER) and a memory (RAM) which may be required to store digital signals. The working principle of the conventional integral ADC is as shown in FIG. 2, wherein the VIN represented by the heavy line is an input signal of the ADC, the VRAMP represented by the fine line is a reference voltage signal of the ADC. Where the t1 is the starting time of the timing cycle, the t2 is the moment when the voltage of the VRAMP starts to rise over time, the t3 is the time when the input voltage of the VIN and the VRAMP intersect, and the t4 is ending time of the VRAMP voltage rises with time. The voltage rise range of the VRAMP from t2 to t4 is indicated by VFS, which is the full-scale input range of the ADC. The t5 is the end of the timing cycle, and one cycle of the ADC conversion period is from t1 to t5, namely time T. The effective analog input voltage of the ADC is the difference between the voltage of the VIN signal and the initial voltage of the VRAMP signal (that is, the constant voltage at time t1~t2), and is indicated by $\Delta$ VIN. The counter in the ADC starts to count from 0 at the time t2 with a fix clock (set as CLK) until the time t3 when the comparator flips, if the effective input signal is $\Delta$VIN, the output of the ADC is:

$$DN = \frac{t3 - t2}{1/CLK} = \frac{\Delta VIN}{VFS} * 2^N \qquad (1)$$

Wherein the N is the resolution of the ADC.

Finally, the input/output transfer characteristics of the ADC can be expressed as:

$$\Delta VIN = kv * DN \qquad (2)$$

Wherein the $\Delta$VIN is an input signal, the DN is a digital code which is finally converted by the ADC, and the kv is a fixed coefficient, which is determined by the resolution and the input full scale of the ADC (the VFS/2N in the formula ①).

FIG. 3 is a conventional generation mode of the reference voltage VRAMP in FIG. 2, that is, using an integrator or a digital-to-analog converter (DAC). The integrator or the DAC generally comprises an input reference voltage VREF, an output VOUT and an input sequential signal (not shown in the figure). The output voltage VOUT is controlled by the sequential signal to be a constant initial voltage or a voltage signal which changes linearly with time, the output voltage VOUT is the reference voltage VRAMP of the integral ADC, and when the reference voltage VRAMP changes linearly with the time, the formula is given as follows:

$$VRAMP = k * Vref * t \qquad (3)$$

Wherein, the Vref is the input reference voltage of the integrator or the DAC, and which is a constant value, the t is the time, the k is a constant coefficient, and the coefficient is related to the parameter setting of the integrator or the DAC. The input/output transfer characteristic of the integral ADC using the reference voltage is shown in a formula ②).

The conversion rate of the integral ADC is slow due to the working principle of the integral ADC. To increase the conversion rate, the prior art is shown in FIG. 4, the conversion rate of the integral ADC is improved by changing the waveform of the reference voltage VRAMP of the ADC. That is, compared with the conventional VRAMP waveform shown by the fine line in the graph, the VRAMP waveform shown by the gray line in the graph is changed. The VRAMP waveform showed by the gray line is a polygonal line during the integration stage, which is changed from a straight line by changing the slope of the VRAMP during the integration stage. The generation mode of the VRAMP is generally to add a control signal in a conventional integrator or DAC circuit, at the set time point, the slope of the output voltage VRAMP is changed by the control signal in the integration phase. The input/output transfer characteristic of the integral ADC using the reference voltage VRAMP can be changed, and the conventional ADC transfer characteristic shown in the formula ② can be demodulated through a cascade digital signal processing system. Therefore, the turning point of the polyline and the slope of the VRAMP should be known in the digital processing system. Because usually there are many turning points, the conversion rate of the ADC can be increased (the conversion period of the ADC can be shortened from the original T as shown in figure to T1). Nevertheless, the above implementation mode is relatively complex, is not easy to expand, and the voltage change of the VRAMP at the turning points of the polyline are not ideal, so that the linearity of the finally-restored ADC transfer characteristic is poor.

SUMMARY

The present disclosure aims to overcome the defects in the prior art, the invention provides a system and method for regulating transfer characteristics of an integral analog-to-digital converter, so that the conversion period is shortened, and the conversion efficiency is improved.

In order to achieve the aim, the invention provides a system for regulating transfer characteristics of an integral analog-to-digital converter, comprises a cascade N-stage integrator structure having N integrators, the input end of the first integrator is connected to a voltage, the output end of each integrator is connected to the input end of the adjacent integrator, and the output end of the Nth integrator is connected to an output node (VRAMP), wherein the N is a positive integer and larger than or equal to 2; in the cascade N-stage integrator, the voltage of the output node (VRAMP) is in direct proportion relation with the time to the power of N.

Preferably, each integrator comprises a resistor, a capacitor, an operational transconductance amplifier and a switch; wherein, for each integrator, the positive input end of the operational transconductance amplifier is connected to the voltage source (VCM); one end of the resistor is connected to the reverse input end of the operational transconductance amplifier at a node, the two ends of the capacitor are connected to the node and the output end of the operational transconductance amplifier respectively; the two ends of the switch is connected to the two ends of the capacitor in parallel, and the other end of the resistor is connected to the input end of the integrator; the output end of the operational transconductance amplifier is connected to the input end of the adjacent integrator.

Preferably, the number of the integrators is three.

In order to achieve the above purpose, the invention also provides a method for regulating transfer characteristics of an integral analog-to-digital converter by using the above system, the method comprising:

forming the cascade N-stage integrator structure using N integrators;

connecting the input end of the first integrator with a voltage;

connecting the output end of the Nth integrator to an output node (VRAMP), and connecting the output end of each integrator with the input end of the adjacent integrator, so that the voltage change of the output of the Nth integrator to the output node (VRAMP) is in direct proportion with time to the power of N.

Preferably, each integrator comprises a resistor, a capacitor, an operational transconductance amplifier and a switch; wherein for each integrator, the positive input end of the operational transconductance amplifier is connected to a voltage source (VCM), and one end of the resistor is connected to the reverse input end of the operational transconductance amplifier at a node, and the two ends of the capacitor are connected to the node and the output end of the operational transconductance amplifier respectively; and the switch is connected to the two ends of the capacitor in parallel, and the other end of the resistor is connected to the input end of the integrator; the output end of the operational transconductance amplifier is connected to the input end of the adjacent integrator.

The system for regulating transfer characteristics of the integral analog-to-digital converter according to the invention, uses an integrator cascade to generate a reference voltage. The realization method is simple, and the cascade digital signal processing is more convenient. It can reduce the conversion time of the ADC and improve the conversion rate of the ADC. Compared with the existing polyline mode, the method proposed by the invention can achieve better linearity, and it can be easily extended to cascade multilevel integrators.

BRIEF DESCRIPTION OF THE DRAWINGS

In order to better understand the purpose, characteristics and advantages of the present disclosure, the following is a detailed description of preferred embodiments of the present disclosure in combination with the attached drawings, wherein.

DETAILED DESCRIPTION

In order to make the content of the invention clearer and easier to understand, the following is a further explanation of the content of the invention combined with the attached drawings of the manual. Of course, the invention is not limited to the specific embodiment, and the general replacement familiar to the person having ordinary skill in the art is also covered by the protection scope of the invention.

In the invention, a system for regulating transfer characteristics of an integral analog-to-digital converter has a cascade N-stage integrator structure formed by N integrators, the input end of the first integrator is connected to a reference voltage, the output end of each integrator is connected to the input end of an adjacent integrator, and the output end of the Nth integrator is connected to an output node (VRAMP). Wherein N is a positive integer and larger than or equal to 2. In the cascade N-stage integrator, the voltage change of the output node (VRAMP) is in direct proportion relation with the time to the power of N.

In one embodiment, each integrator includes a resistor, a capacitor, an operational transconductance amplifier, and a switch. Wherein, for each integrator, the positive input end of the operational transconductance amplifier is connected to a the common mode voltage (VCM), one end of the resistor is connected to the reverse input end of the operational transconductance amplifier at a node, the two ends of the capacitor are connected to the node and the output end of the operational transconductance amplifier respectively; the switch is connected to the two ends of the capacitor in parallel, and the other end of the resistor is connected to the input end of the integrator; the output end of the operational transconductance amplifier is connected to the input end of the adjacent integrator.

The present disclosure is described in further detail below with reference to FIGS. 5-10 and specific embodiments. It should be noted that the FIGs are in a very simplified form, and the non-precise proportion is used, and are only used for conveniently and clearly achieving the purpose of assisting in describing the embodiment of the present disclosure.

Figure 6:
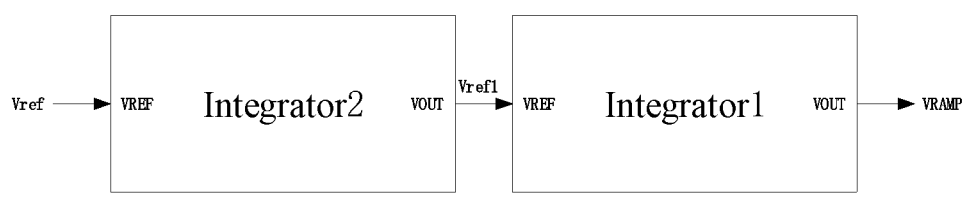
FIG. 6 is a schematic diagram of a system for regulating transfer characteristics of an integral analog-to-digital converter according to a preferred embodiment of the present disclosure
Figure 7:
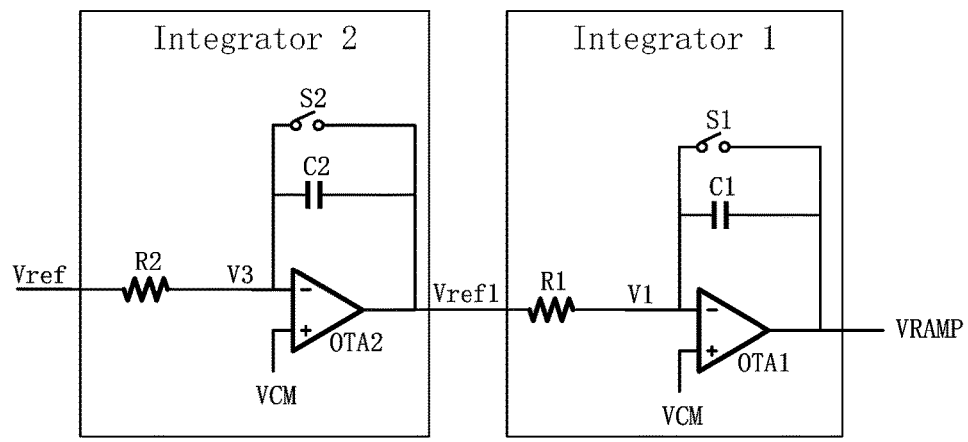
FIG. 7 is a specific circuit structure diagram of a reference voltage VRAMP generating mode in a method for regulating transfer characteristics of an integral analog-to-digital converter according to a preferred embodiment of the present disclosure

In this embodiment, the integral analog-to-digital converter having two integrators is used as an example for description. Please refer to FIG. 6 and FIG. 7, FIG. 6 is a schematic diagram of a system for regulating transfer characteristics of an integral analog-to-digital converter according to a preferred embodiment of the present disclosure, FIG. 7 is a specific circuit structure diagram of a reference voltage VRAMP generating mode in a method for regulating transfer characteristics of an integral analog-to-digital converter according to a preferred embodiment of the present disclosure. The cascaded two-stage integrator structure has two integrators (an integrator 1 and an integrator 2). The integrator 1 includes an operational transconductance amplifier OTA1, a resistor R1, a capacitor C1 and a switch S1. The reverse input end of the operational transconductance amplifier OTA1 is connected to the node V1, the positive input end of the operational transconductance amplifier OTA1 is connected to a voltage source VCM, and the output end of the operational transconductance amplifier OTA1 is connected to the output node (VRAMP), the two ends of the capacitor C1 are connected to the node V1 and the node VRAMP respectively, the two ends of the switch S1 are connected to connect the node V1 and the node VRAMP respectively, and the two ends of the resistor R1 are connected to the node V1 and the node Vref1 respectively. Wherein the node Vref1 is the input voltage of the integrator 1 and is also the output end voltage of an integrator 2. The integrator 2 is composed of an operational amplifier OTA2, a resistor R2, a capacitor C2 and a switch S2. The reverse input end of the OTA2 is connected to a node V3, and the positive input end of the OTA2 is connected to a voltage source VCM, the output end of the operational amplifier OTA2 is connected to the node Vref1, and the two ends of the capacitor C2 are connected to the node V3 and the node Vref1 respectively, the two ends of the switch S2 are connected to the node V3 and the node Vref1 respectively, and the two ends of the resistor R2 are connected to the node V3 and the node Vref respectively, wherein the node Vref is input reference voltage.

Figure 1:
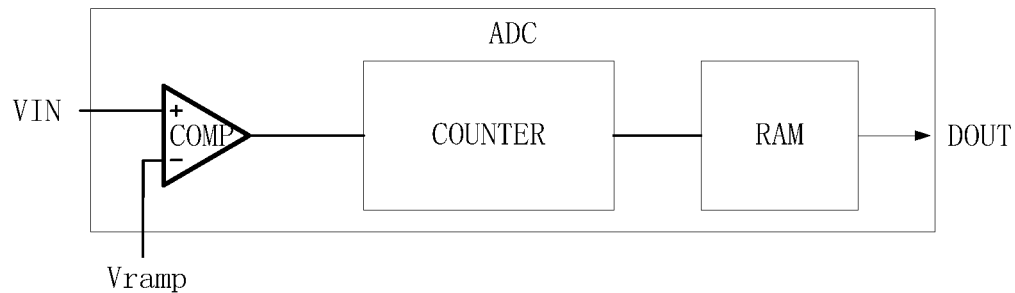
FIG. 1 is a schematic structural diagram of a traditional single integral ADC
Figure 2:
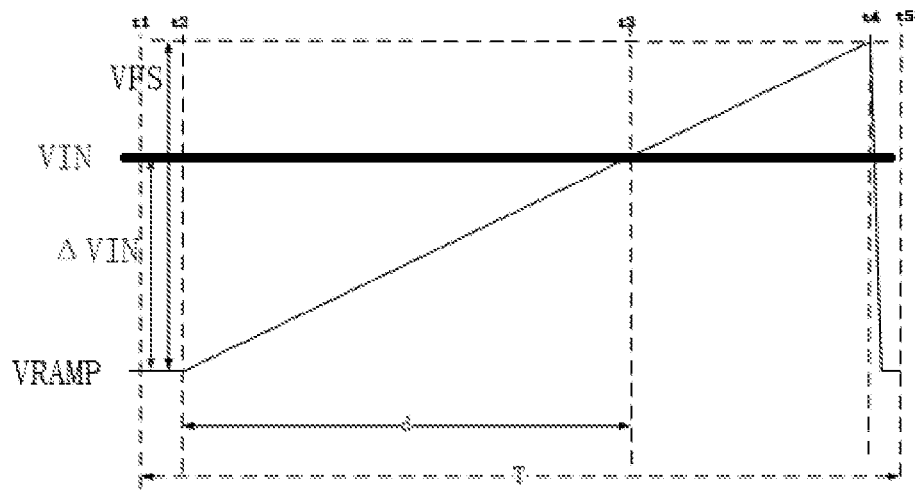
FIG. 2 is a working principle diagram of a traditional single integral ADC
Figure 3:
FIG. 3 is a schematic diagram of a traditional generation mode of the reference voltage VRAMP of the integral ADC
Figure 4:
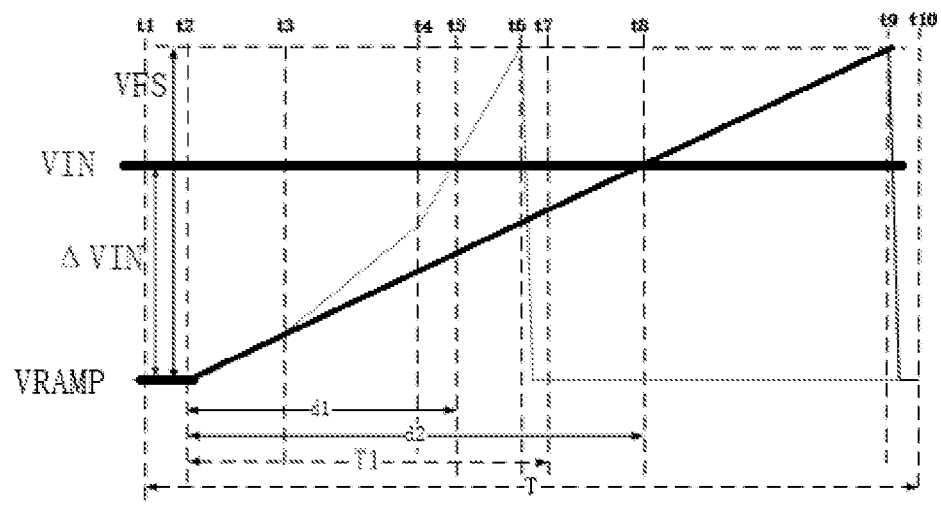
FIG. 4 is a working principle diagram of an existing method for regulating transfer characteristics of an integral analog-to-digital converter
Figure 5:
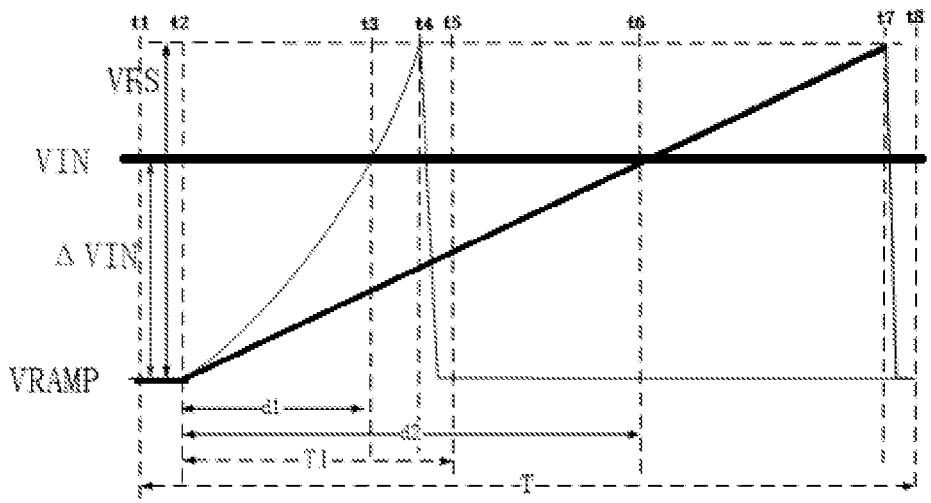
FIG. 5 is a working principle diagram of a method for regulating transfer characteristics of an integral analog-to-digital converter according to a preferred embodiment of the present disclosure

Refer to FIG. 5 combined with FIG. 6 and FIG. 7, in the cascaded two-stage integrator structure composed of the two integrators, the integrator 2 is used for achieving the final voltage of the output node (VRAMP) is in direct proportion relation with the time to the power of 2. According to the properties of the integrator, when the VRAMP voltage starts to change with time, the output voltage is expressed as follows:

$$Vref1 = VCM + \frac{(Vref - V3)}{R2} * C2 * t, \quad (6)$$

$$VRAMP = VCM + \frac{(Vref1 - V1)}{R1} * C1 * t, \quad (7)$$

Wherein the common mode voltage VCM is taken as the initial voltage of the VRAMP, that is, when the t=0, the VRAMP=VCM.

In addition, according to the virtual short characteristic of the input end of the operational transconductance amplifier, the V1=VCM, the formula (6) and the formula (7), the formula (8) can be obtained as follows:

$$VRAMP = VCM + \frac{(Vref - VCM)}{R1 * R2} * C1 * C2 * t^2, \quad (8)$$

As shown in the formula (8), the follow-up of the voltage VRAMP is the quadratic term of time t, which can be used as the reference voltage of the integral ADC to realize the function of regulating transfer characteristics of the integral ADC.

According to the working principle of the ADC, the follow-up of the voltage VRAMP in the above formula (8), namely the time $t^2$, can be used as the reference voltage of the integral ADC. The VCM is just the initial voltage of the VRAMP. When the input of the ADC is $\Delta$VIN, the effective counting time $\Delta$t of the counter in the ADC is:

$$\Delta VIN = \frac{(Vref - VCM)}{R1 * R2} * C1 * C2 * \Delta t^2$$

then:

$$\Delta t = \sqrt{\frac{\Delta VIN}{(Vref - VCM) * C1 * C2 / (R1 * R2)}}$$

According to the working principle of the ADC, the value counted by the counter in the $\Delta$t time is the digital code DN, which is converted by the ADC finally when the $\Delta$VIN is inputted:

$$DN = \Delta t * CLK$$

Therefore, the expression for the digital code DN as following when the input of the ADC is $\Delta$ VIN and using the VRAMP shown in the formula (8) as a reference voltage:

$$DN = \sqrt{\frac{\Delta VIN}{(Vref - VCM) * C1 * C2 / (R1 * R2)}} * CLK \quad (9)$$

Wherein, the CLK is the clock frequency of the counter in the ADC; and now, the transfer characteristic of the ADC can be expressed as the following formula:

$$\Delta VIN = k * DN^2 \quad 10$$

Wherein, the k is a coefficient, which is related to a parameter selection of the integrator and the counter clock CLK of the ADC, that is:

$$k = \frac{(Vref - VCM) * C1 * C2 / (R1 * R2)}{CLK^2}$$

Figure 8:
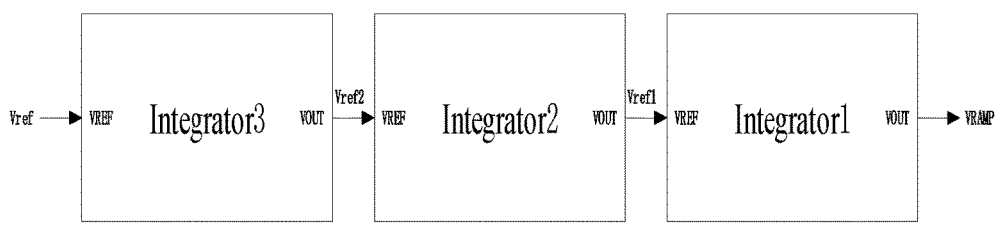
FIG. 8 is a schematic diagram of a reference voltage VRAMP generated by three-times extended iterative according to an embodiment of the present disclosure
Figure 9:
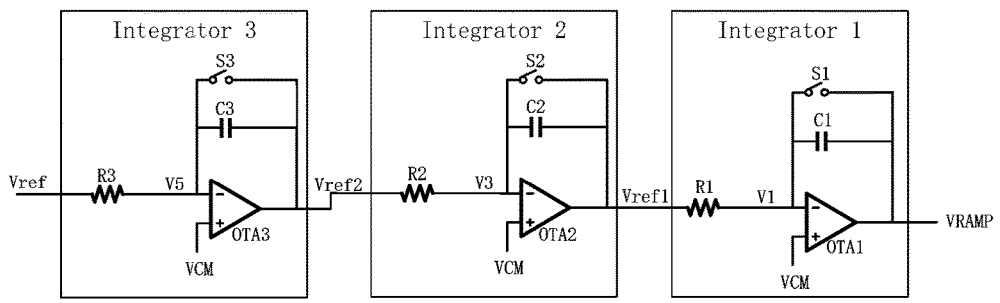
FIG. 9 is a specific circuit structure diagram of a reference voltage VRAMP generated by three-times extended iterative according to an embodiment of the present disclosure

Refer to FIG. 8 and FIG. 9, FIG. 8 is a schematic diagram of a reference voltage VRAMP generated by three-time extended iterative according to an embodiment of the present disclosure, FIG. 9 is a specific circuit structure diagram of a reference voltage VRAMP generated by three-time extended iterative according to an embodiment of the present disclosure. According to the cascaded three-stage integrator in FIG. 8, the voltage change outputted by the output node VRAMP in the integration period is in direct proportion relation with the time to the power of 3, so that the input signal in the transfer characteristic of the ADC is in direct proportion relation with the output digital code to the power of 3.

Figure 10:
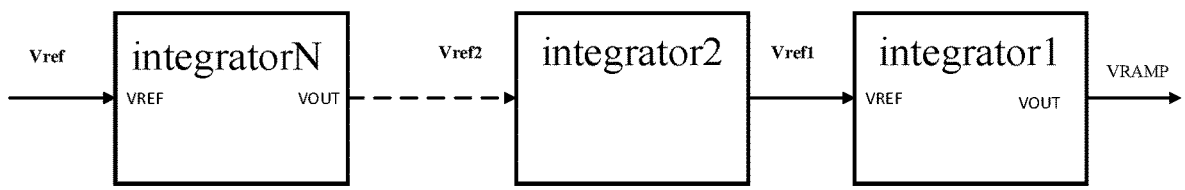
FIG. 10 is a schematic diagram of a reference voltage VRAMP generated by N-time extended iterative according to an embodiment of the present disclosure

Referring to FIG. 10, FIG. 10 is a schematic diagram of a reference voltage VRAMP generated by N-time extended iterative according to an embodiment of the present disclosure. The voltage change outputted by the output node VRAMP through the cascade N-stage integrator in the integration period is in direct proportion with time to the power of N, so that the input signal in the transfer characteristic of the ADC is in direct proportion with the output digital code to the power of N.

Moreover, in the embodiment, the invention further provides a method adopting the system for regulating transfer characteristics of an integral analog-to-digital converter, the method for regulating transfer characteristics of an integral analog-to-digital converter comprises the following steps: forming the cascade N-stage integrator structure using N integrators; connecting the input end of the first integrator with a reference voltage; connecting the output end of the Nth integrator to an output node (VRAMP), connecting the output end of each integrator with the input end of the adjacent integrator, so that the voltage change of the output of the Nth integrator to the output node (VRAMP) is in direct proportion with time to the power of N.

Specifically, each integrator in the embodiment comprises a resistor, a capacitor, an operational transconductance amplifier and a switch. For each integrator, the positive input end of the operational transconductance amplifier is connected to a voltage source (VCM), and one end of the resistor is connected to the reverse input end of the operational transconductance amplifier at a node, the two ends of the capacitor are connected to the node and the output end of the operational transconductance amplifier respectively; the switch is connected to the two ends of the capacitor in parallel, and the other end of the resistor is connected to the input end of the integrator; the output end of the operational transconductance amplifier is connected to the input end of the other integrator which is adjacent to the operational transconductance amplifier.

While this invention has been particularly shown and described with references to preferred embodiments thereof, if will be understood by those skilled in the art that various changes in form and details may be made herein without departing from the spirit and scope of the invention as defined by the appended claims.

What is claimed is:

1. A system for regulating transfer characteristics of an integral analog-to-digital converter, comprising:
a cascade N-stage integrator structure having N integrators, the input end of the first integrator is connected to a voltage, the output end of each integrator is connected to the input end of the adjacent integrator, and the output end of the Nth integrator is connected to an output node (VRAMP), wherein the N is a positive integer and larger than or equal to 2; in the cascade N-stage integrator structure, the voltage of the output node (VRAMP) is in direct proportion relation with the time to the power of N.

2. The system of claim 1, wherein, each integrator comprises a resistor, a capacitor, an operational transconductance amplifier and a switch; wherein, for each integrator, the positive input end of the operational transconductance amplifier is connected to the common mode voltage (VCM); one end of the resistor is connected to the reverse input end of the operational transconductance amplifier at a node, the two ends of the capacitor are connected to the node and the output end of the operational transconductance amplifier respectively; the two ends of the switch is connected to the two ends of the capacitor in parallel, and the other end of the resistor is connected to the input end of the integrator; the output end of the operational transconductance amplifier is connected to the input end of the adjacent integrator.

3. The system of claim 2, wherein the number of the integrators is three.

4. The system of claim 1, wherein the number of the integrators is three.

5. A method for regulating transfer characteristics of an integral analog-to-digital converter by using adjusting system of claim 1, comprising:
forming the cascade N-stage integrator structure using N integrators;
connecting the input end of the first integrator with a voltage;
connecting the output end of the Nth integrator to an output node (VRAMP), and
connecting the output end of each integrator with the input end of the adjacent integrator, so that the voltage changes of the output of the Nth integrator, namely the output node VRAMP, is in direct proportion with time to the power of N.

6. The method of claim 5, wherein, each integrator comprises a resistor, a capacitor, an operational transconductance amplifier and a switch; wherein for each integrator, the positive input end of the operational transconductance amplifier is connected to a voltage source (VCM), and one end of the resistor is connected to the reverse input end of the operational transconductance amplifier at a node, and the two ends of the capacitor are connected to the node and the output end of the operational transconductance amplifier respectively; and the switch is connected to the two ends of the capacitor in parallel, and the other end of the resistor is connected to the input end of the integrator; the output end of the operational transconductance amplifier is connected to the input end of the adjacent integrator.

* * * * *